United States Patent
Hatakeyama et al.

(10) Patent No.: US 6,533,860 B1
(45) Date of Patent: Mar. 18, 2003

(54) PROCESS FOR PREPARING GREEN PIGMENT COMPOSITION CONTAINING NO HALOGEN

(75) Inventors: Yasuhiko Hatakeyama, Tokyo (JP); Toshikazu Tamura, Tokyo (JP); Shigeki Kato, Tokyo (JP)

(73) Assignee: Toyo Ink Mfg. Co., Ltd., Tokyo (JP)

( * ) Notice: Subject to any disclaimer, the term of this patent is extended or adjusted under 35 U.S.C. 154(b) by 0 days.

(21) Appl. No.: 09/763,354

(22) PCT Filed: Jun. 20, 2000

(86) PCT No.: PCT/JP00/04019

§ 371 (c)(1),
(2), (4) Date: Feb. 21, 2001

(87) PCT Pub. No.: WO00/78873

PCT Pub. Date: Dec. 28, 2000

(30) Foreign Application Priority Data

Jun. 21, 1999 (JP) ............................................ 11-173498

(51) Int. Cl.[7] .............................................. C09B 67/22
(52) U.S. Cl. ...................... 106/494; 106/410; 106/411; 106/412; 106/413; 106/493; 106/496; 106/498
(58) Field of Search ................................. 106/494, 410, 106/411, 412, 413, 493, 496, 498

(56) References Cited

FOREIGN PATENT DOCUMENTS

| JP | 63-46472 | * | 2/1988 |
| JP | 7-258592 | | 10/1995 |
| JP | 2000-007974 | | 1/2000 |
| JP | 2000-063699 | | 2/2000 |
| JP | 2000-253850 | * | 9/2000 |
| JP | 2001-261995 | * | 9/2001 |

OTHER PUBLICATIONS

Chemical Abstract No. 93:9626, abstract of Romanian Patent Specification No. 65597 (Dec. 1978).*
Chemical Abstract No. 107:178135, abstract of Chinses Patent Specification No. 85100268 (Jul. 1986).*
Asakura Shoten, Shikizai Kyokai Ed., p. 332, "Shikizai Kougaku Handbook", Nov. 25, 1989.

* cited by examiner

*Primary Examiner*—Anthony J. Green
(74) *Attorney, Agent, or Firm*—Oblon, Spivak, McClelland, Maier & Neustadt, P.C.

(57) ABSTRACT

A method for preparing a green pigment composition in which a mixture of a halogen-free organic blue pigment material and a halogen-free organic yellow pigment material are subjected to an atomizing process. The atomizing process is desirably (1) a co-kneading process conducted in the presence of a grinding material, or (2) a process that comprises dissolving the above-mentioned blue pigment material and yellow pigment material in a strong acid to obtain a solution, and injecting this solution into water to obtain a re-deposited substance. The method prevents the "fogging" problem, and provides high quality green shade having simultaneously sufficient light resistance and heat resistance. The resulting organic pigment composition is excellent also in plastics coloring use requiring a heating process at higher temperature, and has high safety/sanitation property, and causes no environmental problem.

18 Claims, No Drawings

PROCESS FOR PREPARING GREEN PIGMENT COMPOSITION CONTAINING NO HALOGEN

TECHNICAL FIELD

The present invention relates to a method for producing a novel green pigment composition that has clear hue, excellent light resistance and heat resistance, and that provides a green coloring material which causes no environmental problem since safety/sanitation related property is highly achieved and harmful substances are not generated at all in incineration.

BACKGROUND ART

Recently, problems concerning safety and sanitation due to some specific chemical substances and environmental pollutions by dioxin and the like have been becoming serious. Also in general public, there has been increasing concern about the safety to human bodies of some chemical substances and environmental problems. Under such conditions, promoting problem-solutions in industrial products from the viewpoint of their materials used has been advocated. Coloring materials such as pigments are not the exception that can be ignored. Particularly, under the recent circumstance, safety against human bodies and environments of the decomposed substances and by-products generated when the products are scrapped and burnt out has been regarded as the manufacturers' responsibility. Further particularly, there is a tendency that halides, which may cause direct generation of PCB and dioxin in their incineration, are an excluder from the material components of products of routine use.

Presently, green color development in prints, colored substances and the like is typically effected by color mixing mainly using halogenated phthalocyanines typified by highly-halogenated phthalocyanine green, or by color mixing of phthalocyanine blue and disazo yellow. It is no exaggeration to say that a green pigment containing utterly no halogen atom in its molecular structure or in its pigmentary composition has not so far been found at all.

In the former case, due to halogen (chlorine) present in a large amount in the pigment's molecular structure, there is a possibility of by-production or modification of the pigment substance into a chemical substance having high toxicity such as dioxin, in incinerating the prints or colored substances. In the latter case, although disazo yellow pigments such as, e.g., C. I. PIGMENT YELLOW 83, 12, 13, 14, 17, 55, and 87 have themselves sufficient heat resistance, if they are heated up to the temperature of 200° C. or more in the molding process in their use as coloring materials in plastics, they are thermally decomposed. Therefore, the latter case is not preferable from safety/sanitation viewpoint and environmental viewpoint, also.

Because of such a circumstance, there have been trials to obtain a coloring material having the intended green hue and also having light resistance and heat resistance, by mixing a halogen-free phthalocyanine blue pigment and a halogen-free yellow high-grade pigment and intensely dispersing the mixture. However, by the conventional simple color mixing method, namely, mixing of a plurality of pigments and intense dispersion thereof, a coloring material having unclear hue can only be obtained.

In general, when a printing material or other substrate to be colored is colored by the application of a coloring material, different hues may be observed depending on the viewing angle. This phenomenon is called dichroism, and may be generated depending on the form and dispersion condition of the pigment particles used. Particularly, in a coated film formed by an ink or paint in which transparency and clearness of the film are important, the film may reflect some light having a specific wavelength at certain angle and the entire film portions reveal whitish, opaque, and hazy appearance, in some cases. Of phenomena of dichroism, such a phenomenon is particularly called "fogging". Such a hue change tends to appear particularly in a coloring material having low brightness, such as black, violet, blue, or green one. Among them, in a conventional green coloring material made by color mixing, the fogging phenomenon particularly tends to occur since color is controlled by mixing different pigment particles, and even if color control is tried to give the same hue as that of a halogenated phthalocyanine pigment, clearness of the resulting hue is extremely low. In a conventional green coloring material obtained by color mixing, because of difference in properties and conditions of respective pigments, each pigment has not been dispersed uniformly, consequently, hue has not been settled, and fogging and irregular color particularly have tend to occur.

Thus, a green pigment or a green pigment composition that maintains qualities required as a green coloring material, such as clear hue, good weather resistance and heat resistance, and that is satisfactory at the same time in the points of safety/sanitation related and environmental pollution problems above-mentioned, has not been found yet in the present state of the art.

The present inventors have intensively studied pigment selections, pigment qualities, particularly pigmentation processes, to overcome the above-mentioned present state, resultantly leading to completion of the present invention.

DISCLOSURE OF THE INVENTION

The present invention is a method for preparing a green pigment composition, the method comprising subjecting a halogen-free blue pigment material and a halogen-free yellow pigment material to an atomizing process in mixture. From a vehicle component and a green pigment composition prepared by the method, one can obtain pigment dispersion.

The atomizing process is preferably a co-kneading process conducted in the presence of a grinding agent. In this case, the co-kneading is desirably conducted in the presence of a glycol solvent. The grinding agent is preferably an inorganic salt.

Also, the atomizing process preferably comprises (a) dissolving the blue pigment material and yellow pigment material in a strong acid to obtain a solution and (b) injecting the solution into water to obtain a re-deposited substance. The strong acid may be, for instance, sulfuric acid, trifluoroacetic acid, polyphosphoric acid, or chlorosulfonic acid.

In the method for preparing a green pigment composition according to the invention, the ratio of the blue pigment material to the yellow pigment material is preferably from 90:10 to 40:60 by weight. In the preparation method, the blue pigment material may be at least one selected from the group consisting of phthalocyanine-type, threne-type, and indigo-type blue pigments. Also in the present method, the yellow pigment material may be at least one selected from the group consisting of azo-type, benzimidazolone-type, isoindoline-type, flavanthrone-type, anthrapyrimidine-type, anthraquinone-type, quinolinoquinolone-type, fluoroflavine-type, and fluorovine-type yellow pigments. It is desirable that the yellow pigment material is at least one pigment material selected from the group consisting of quinoloquinolone, fluoflavine, and fluorovine.

Pigment dispersion is a fine particle dispersion system in which each fine-size primary particle is in itself an assembly of crystallites of pigment molecules and in turn each pigment aggregate dispersed is one made of a plurality of such primary particles. The present inventors have doubted that by conventional pigment dispersion methods it might be difficult to attain a uniformly dispersed pigment system when considering the circumstance confronted, a system composed of fine particles and where strong interfacial effect is present therefore, particularly to make fine pigment particles from different production origins to mutually contact or access at their interfacial level. The present inventors now presume that in a green coloring material attained based on color mixing, the subject matter of the present invention, such a mutual access of different types of fine particles and uniform dispersion thereof have both been insufficient at a microscopic order and that the consequence has been extremely insufficient qualities in the conventional green coloring materials.

It can be understood that the present invention focuses on the unique interfacial environment provided by an atomizing process of pigment materials and effectively utilizes it in practice to solve the problems from their origins, problem origins that the conventional green coloring materials seem to have been confronted with so far, and as a consequence, to realize a green shade having qualities equal to or even superior than the qualities of other shades.

In general, an atomizing process of fine particles, pigment particles for instance, can be recognized as a process in which under various particle scales (primary particle, that is a collection of pigment molecule's crystallites, and the aggregate, which is composed of a plurality of primary particles) each particle's specific surface area is increased and the number of unstable molecules located at the surface portions is increased accordingly. Therefore in the process, the system is temporarily put under an unusual condition that is thermodynamically extremely unstable and has high energy. By subjecting both types of pigment particles to such an unstable system, which may be realized in an atomization process as above mentioned and where there is a nature existing to stabilize itself by mutual particle adhesion, mutual dispersion of both types of pigments at a microscopic level is propelled strongly. The present invention have achieved, consequently, a high-quality green shade on a color mixing basis, which has been the one strongly desired to date.

The following examples will successfully verify the effectiveness of the above-mentioned concept of the present invention.

BEST MODE FOR CARRYING OUT THE INVENTION

The present invention will be described in detail below.

The blue pigment used in the present invention is not particularly restricted, provided that it is a halogen-free blue pigment, and the grade can be determined before use depending on the intended shade. Examples of blue pigments that may be used in the present invention, indicated by the Colour Index numbers, are C. I. PIGMENT BLUE 15, C. I. PIGMENT BLUE 15:2, C. I. PIGMENT BLUE 15:3, C. I. PIGMENT BLUE 15:4, C. I. PIGMENT BLUE 15:5, C. I. PIGMENT BLUE 15:6, C. I. PIGMENT BLUE 16, C. I. PIGMENT BLUE 60, C. I. PIGMENT BLUE 64, and C. I. PIGMENT BLUE 66.

Regarding the phthalocyanine pigment, those containing Cu as a central metal atom are generally used blue pigments, and even those containing other central metal atoms such as Ni, Co, Fe and those of metal-free type may also be used. Also regarding its crystal form, phthalocyanine pigments having various crystal forms depending on the intended hue, such as α-form, β-form, and ε-form, may be used. Among them, copper phthalocyanine is particularly preferable from the standpoint of cost.

The yellow pigment used in the present invention is not particularly restricted, provided that it contains no halogen and is other than disazo yellow pigments. However, yellow pigments of benzimidazolone-type, isoindoline-type, flavanthrone-type, anthrapyrimidine-type, anthraquinone-type, quinolinoquinolone-type, fluoroflavine-type, or fluorovine-type are desirable in view of cases heated to 200° C. or more such as use as a coloring agent for plastics, and to impart high light resistance and high heat resistance. Some examples of yellow pigments that may be used in the present invention are C. I. Pigment Yellow 1, 4, 5, 9, 24, 42, 65, 61, 62, 74, 100, 101, 104, 117, 120, 123, 129, 133, 139, 147, 148, 151, 155, 168, 169, 175, 180, 181, 182, 185, 192, 194, quinolinoquinolone, dimethylquinolinoquinolone, dimethylfluoflavine, and the following:

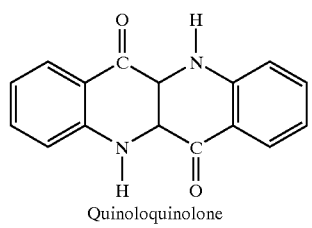
Quinoloquinolone (1)

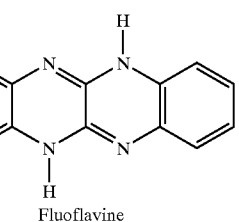
Fluoflavine (2)

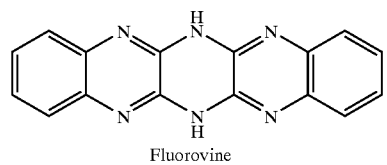
Fluorovine (3)

The compounding ratio of a blue pigment material to a yellow pigment material may be controlled depending on the intended green shade. In general, the compounding ratio is preferably from 90:10 to 40:60, particularly desirably from 90:10 to 50:50, by weight.

In the method for preparing a green pigment composition of the present invention, a mixture obtained by mixing a blue pigment powder and a yellow pigment powder in advance may be used, or a blue pigment material and a yellow pigment material may be separately charged so as to give a designated ratio, in charging into a kneader or dissolving into a strong acid.

In a process of co-kneading, for instance, a blue pigment and a yellow pigment are charged into a kneader at the above-mentioned ratio, then, kneaded together with a grinding agent containing an inorganic salt such as sodium chloride or potassium chloride and a solvent such as diethylene glycol at a suitable temperature for suitable time. As the grinding agent, sodium chloride is most suitable since it is inexpensive and post treatment after co-kneading is simple. The amount of the grinding agent may be from 1 to 20-fold by weight, more preferably from 4 to 8-fold by weight, to the total weight of pigment materials used. Within suitable solvents that may be used in the co-kneading, glycol solvents that can be dissolved in water such as ethylene glycol, diethylene glycol, triethylene glycol, and polyethylene glycol are included. Diethylene glycol is preferably used.

Desirable temperatures in the kneading process, although depending on the pigment materials to be co-kneaded and compounding ratios of other components, are from 40 to 110° C., and more preferably from 80 to 100° C. The kneading time depends on pigment materials to be co-kneaded, compounding ratios of other components, the green shade intended to be achieved and the like, yet typically from 1 to 8 hours, more suitably from 3 to 4 hours. It is preferable that addition ratio of a solvent, grinding material and the like and kneading temperature are controlled so that the intended hue is obtained by co-kneading of 3 to 4 hours. After completion of kneading, a kneaded pigment cake may be added to a large amount of water to give slurry. In some cases, heating may be effected in this operation, to give uniform slurry. Then, this slurry is filtrated and washed with water. In some cases, a solvent such as methanol and the like are also used in this operation, and this slurry is washed to remove a grinding material and kneading solvent completely to obtain a wet cake of the intended green pigment composition.

In a method in which a pigment substance is dissolved in a strong acid and re-deposited (hereinafter referred to also as strong acid method), the above-mentioned blue pigment material and yellow pigment material are dissolved in a strong acid such as conc. sulfuric acid, trifluoroacetic acid, chlorosulfonic acid, polyphosphoric acid and the like, to give a uniform solution, then, this uniform solution is gradually poured into a large amount of ice water for re-deposition to obtain green slurry. The deposit in the resulted slurry is filtrated and washed with a large amount of water to obtain a wet cake of a refined green pigment composition. Thereafter, if necessary, the particles are regulated by pigment formation process by a kneader or by emulsion treatment to obtain a green pigment composition of the intended hue.

As the strong acid to be used in the strong acid method, conc. sulfuric acid is most suitable, and the concentration thereof may be from 90 to 98% by weight, preferably from 95 to 98% by weight. The amount of the strong acid may also vary depending on the ratio of a blue pigment material to a yellow pigment material, and typically from 5 to 30-fold by weight, preferably from 6 to 20-fold by weight, further preferably from 10 to 30-fold by weight based on the total weight of pigments used. The temperature when pigment materials are dissolved in a strong acid may be from 5 to 50° C. without problem, and preferably from 5 to 30° C., further preferably from 10 to 30° C. The amount of water when a dissolved substance is re-deposited may be suitably from 5 to 40-fold by weight based on the strong acid used, and preferably from 10 to 20-fold by weight. In this operation, ice water is usually used to avoid steep temperature increase due to the injection of a strong acid. Particles of re-deposited pigment are generally fairly refined. Therefore, a particle regulation process, a process that has conventionally been called 'pigmentation', may be inserted to access the intended shade.

For moderating aggregation of the finally obtained green pigment, a small amount of a resin or some surfactant may be added in the process of co-kneading or solution deposition with a strong acid.

As to vehicle components usable in the present invention, offset ink vehicles, gravure ink vehicles, paint vehicles, ink vehicles used to printed circuit boards, toner resin, and molding plastic resin are some of the examples.

As the offset ink vehicle, vehicles obtained by combining, as the main components, a rosin-modified phenol resin, rosin-modified maleic acid resin, petroleum resin, or an alkyd resin and the like with a soybean oil, tung oil, or a linseed oil and the like are exemplified.

As the gravure ink vehicle, vehicles obtained by combining, as the main components, a lime rosin resin, polyamide resin, vinyl chloride resin, cyclized rubber, urethane resin, acrylic resin, maleic acid resin, or a nitrocellulose and the like with a solvent such as aliphatic hydrocarbons, aromatic hydrocarbons, halogenated hydrocarbons, alcohols, ketones, esters, ethers, ether/alcohols, ether/esters, water and the like are exemplified.

As the paint vehicle, vehicles obtained by combining, as the main components, a nitrocellulose lacquer, aminoalkyd resin, acryl lacquer, aminoacrylic resin, urethane resin, polyvinylacetal resin, epoxy resin, polyester resin, vinyl chloride resin, vinylidene fluoride resin, vinyl fluoride resin, or a polyether sulfonic resin with a solvent such as aliphatic hydrocarbons, aromatic hydrocarbons, halogenated hydrocarbons, alcohols, ketones, esters, ethers, ether/alcohols, ether/esters, water and the like are exemplified.

As the ink vehicle for the use of printed circuit boards, vehicles obtained by combining, as the main components, an unsaturated-group-containing polycarboxylic acid resin, bisphenol A epoxy compound, ultraviolet ray-curing resin, or thermosetting resin with a polymerization initiator, and a solvent such ketones, esters, ethers, aliphatic hydrocarbons, aromatic hydrocarbons are exemplified.

As the toner resin, polystyrene, styrene-acrylic copolymers, chloride resins, styrene-vinyl acetate copolymers, rosin-modified maleic acid resins, phenol resins, epoxy resins, polyester resins, lower molecular weight polyethylene, lower molecular weight polypropylenes, ionomer resins, polyurethane resins, silicone resins, rosin esters, and rosins are exemplified.

As the molding plastic resin, polyolefin-type resins such as polypropylene, polyethylene, ethylene-propylene copolymers, copolymers of α-olefin with acrylic acid or maleic acid, ethylene-vinyl acetate copolymers, copolymers of ethylene with acrylic acid or maleic anhydride, and the like, vinyl resins such as polyvinyl chloride, polyvinyl acetate and the like, acetal resins such as formal resins, butyral resins and the like, acrylic resins such as polyacrylonitrile, methacrylic resin and the like, styrol resins such as polystyrene, acrylonitrile/butadiene-styrene copolymers and the like, polyester resins such as polyethylene terephthalate, polycarbonate and the like, nylons such as 6-nylon, unsaturated polyester resins, epoxy resins, urea resins, melamine resins, and cellulose resins are exemplified.

As a vehicle resin component, bio-degradable materials such as starch-modified cellulose/xanthone, polyhydroxy butyric acid, polycaprolactone, polylactic acids can also be used as well as those already mentioned.

These vehicles for respective uses are well known to those skilled in the art. There seems to be thus no more detailed description required.

EXAMPLES

The following examples and comparative examples illustrate the present invention concretely, yet they are not intended to limit the scope of the present invention.

Production of Pigment Composition

Example 1

140 g of No. 3 Crude Blue (copper phthalocyanine pigment C. I. PIGMENT BLUE 15:3, manufactured by Toyo Ink Mfg.), 60 g of C. I. PIGMENT YELLOW 185 (PALIOTOL YELLOW D 1155, manufactured by BASF), 1200 g of sodium chloride and 200 g of diethylene glycol were charged in a 3 L kneader. The mixture was co-kneaded for 4 hours at 95° C. After co-kneading, the kneaded cake was taken out, and added into 10 L of water to give slurry. The resulted slurry was stirred while heating at 90° C. for 1 hour, then, filtrated. The resulted deposit was washed with water, dried at 90° C. for 12 hours, and pulverized (150 mesh) to obtain 195 g of a green powder.

Comparative Example 1

200 g of No. 3 Crude Blue (copper phthalocyanine pigment C. I. PIGMENT BLUE 15:3, manufactured by Toyo Ink Mfg.), 1200 g of sodium chloride and 200 g of diethylene glycol were charged in a 3 L kneader. The mixture was kneaded for 4 hours at 95° C. After the kneading, the kneaded cake was taken out, and added into 10 L of water to give slurry. The resulted slurry was stirred while heating at 90° C. for 1 hour, then, filtrated. The resulted deposit was washed with water, dried at 90° C. for 12 hours, and ground (150 mesh) to obtain 197 g of a blue powder.

Separately, 200 g of C. I. PIGMENT YELLOW 185 used in Example 1, 1200 g of sodium chloride and 200 g of diethylene glycol were charged in a 3 L kneader. The mixture was kneaded for 4 hours at 95° C. After the kneading, the kneaded cake was taken out, and added into 10 L of water to give slurry. The resulted slurry was stirred while heating at 90° C. for 1 hour, then, filtrated. The resulted deposit was washed with water, dried at 90° C. for 12 hours, and pulverized (150 mesh) to obtain 195 g of a yellow powder.

140 g of the resulted blue pigment powder and 60 g of the resulted yellow pigment powder were mixed to obtain a powder having substantially the same composition as in Example 1.

Example 2

Co-kneading and subsequent treatments were conducted in the same manner as in Example 1 except that 120 g of No. 3 Crude Blue and 80 g of C. I. PIGMENT YELLOW 151 (HASTAPERM. YELLOW H4G, manufactured by CLARIAN) were used instead of 140 g of No. 3 Crude Blue and 60 g of C. I. PIGMENT YELLOW 185, to obtain 198 g of a green powder.

Comparative Example 2

Kneading, post treatment, drying and grinding were conducted in the same manner as in Comparative Example 1 except that C. I. PIGAENT YELLOW 151 used in Example 2 was used instead of C. I. PIGMENT YELLOW 185, to obtain a blue powder and a yellow powder, separately.

120 g of the resulted blue pigment powder and 80 g of the resulted yellow pigment powder were mixed to obtain a powder having substantially the same composition as in Example 2.

Example 3

Co-kneading and subsequent treatments were conducted in the same manner as in Example 1 except that 120 g of No. 3 Crude Blue and 80 g of C. I. PIGMENT YELLOW 167 (SEIKAFAST YELLOW A-3, manufactured by Dainichiseika) were used instead of 140 g of No. 3 Crude Blue and 60 g of C. I. PIGMENT YELLOW 185, to obtain 196 g of a green powder.

Comparative Example 3

Kneading, post treatment, drying and grinding were conducted in the same manner as in Comparative Example 1 except that C. I. PIGMENT YELLOW 167 used in Example 3 was used instead of C. I. PIGMENT YELLOW 185, to obtain a blue powder and a yellow powder, separately.

120 g of the resulted blue pigment powder and 80 g of the resulted yellow pigment powder were mixed to obtain a powder having substantially the same composition as in Example 3.

Example 4

120 g of No. 3 Crude Blue (C. I. PIGMENT BLUE 15:3, manufactured by Toyo Ink Mfg.), 80 g of C. I. PIGMENT YELLOW 180 (HOSTAPERM YELLOW HG, manufactured by CLARLANT), 1200 g of sodium chloride and 200 g of diethylene glycol were charged in a 3 L kneader. The mixture was co-kneaded for 3 hours at 95° C. After the co-kneading, the kneaded cake was taken out, and added into 10 L of water to give slurry. The resulted slurry was stirred while heating at 90° C. for 1 hour, then, filtrated. The resulted deposit was washed with water, dried at 90° C. for 12 hours, and pulverized (150 mesh) to obtain 195 g of a green powder.

Example 5

100 g of C. I. PIGMENT Blue 60 (MYCHESLENE BLUE, manufactured by Sumitomo Chemical Co., Ltd.), 100 g of C. I. PIGMENT YELLOW 180 (HOSTAPERM YELLOW HG, manufactured by CLARIANT, 1000 g of sodium chloride and 200 g of diethylene glycol were charged in a 3 L kneader. The mixture was co-kneaded for 3 hours at 90° C. After co-kneading, the kneaded cake was taken out, and added into 10 L of water to give slurry. The resulted slurry was stirred while heating at 90° C. for 1 hour, then, filtrated. The resulted deposit was washed with water, dried at 90° C. for 12 hours, and pulverized (150 mesh) to obtain 190 g of a green powder.

Comparative Example 4

200 g of No. 3 Crude Blue (copper phthalocyanine pigment C. I. PIGMENT BLUE 15:3, manufactured by Toyo Ink Mfg.), 1200 g of sodium chloride and 200 g of diethylene glycol were charged in a 3 L kneader. .The mixture was kneaded for 3 hours at 95° C. After the kneading, the kneaded cake was taken out, and added into 10 L of water to give slurry. The resulted slurry was stirred while heating at 90° C. for 1 hour, then, filtrated. The resulted deposit was washed with water, dried at 90° C. for 12 hours, and pulverized (150 mesh) to obtain 195 g of a blue powder.

Separately, 200 g of C. I. PIGMENT YELLOW 180 (HOSTAPERM YELLOW HG, manufactured by CLARIAM), 1200 g of sodium chloride and 200 g of diethylene glycol were charged in a 3 L kneader. The mixture was kneaded for 3 hours at 95° C. After the kneading, the kneaded cake was taken out, and added into 10 L of water to give slurry. The resulted slurry was stirred while heating at 90° C. for 1 hour, then, filtrated. The resulted deposit was washed with water, dried at 90° C. for 12 hours, and ground (150 mesh) to obtain 190 g of a yellow powder.

120 g of the resulted blue pigment powder and 80 g of the resulted yellow pigment powder were mixed to obtain a powder having substantially the same composition as in Example 4.

Production of Pigment Dispersion

The powdery pigment compositions produced in Examples 1–3 and Comparative Examples 1–3 were processed into dispersions of paints, printing inks (gravure inks, offset inks, and inks for printed circuit boards) and plastics, respectively, and evaluated.

(1) Paint

To 10 g of each pigment composition was mixed 90 g of a paint vehicle having the following formulation and 300 g of steel balls. The mixture was charged into a 225 ml mayonnaise bottle, and dispersed by a paint conditioner for 1 hour to obtain respective paint compositions.

Formulation of paint vehicle (a) 52 parts by weight of alkyd resin varnish (non-volatile component is 60%), (b) 23 parts by weight of melamine resin varnish (non-volatile component is 50%), and (c) 15 parts by weight of xylene.

(2) Gravure Ink 60 g of acrylic aqueous varnish, 20 g of water, 10 g of a pigment composition prepared, and 150 g of alumina beads were charged in a 225 ml mayonnaise bottle, which was then shaken for 1 hour with a paint conditioner, to obtain respective aqueous gravure inks.

(3) Offset Ink 16 parts by weight of a pigment composition prepared and 54 parts by weight of a rosin-modified phenol resin typically used for printing ink were added to 15 parts by weight of AF Solvent No. 7 (manufactured by Nippon Oil). This mixture was stirred moderately at 50° C. for 1 hour, then, kneaded by a triple roll mill at 60° C. given times, to obtain base ink in which the pigment particles were dispersed to a diameter of 7.5 micron or less. Then, to the resulted base ink was added 22 parts by weight of varnish and 12 parts by weight of AF Solvent No. 7, to prepare final ink.

(4) Dispersion in Plastics

To 0.1 part by weight of each pigment composition was mixed 100 parts by weight of a polyvinyl acetate resin and 0.1 part by weight of zinc stearate by using a tumbler. This mixture was melt-extruded through an extruder, cooled, then cut to produce pigment dispersions in plastics (coloring pellets).

(5) Ink for Printed Circuit Board

To 3 parts by weight of each pigment composition was added 106 parts of an epoxy resin varnish, 10 parts by weight of a hardener for epoxy resin, and 90 parts by weight of precipitating barium sulfate. This mixture was kneaded by a triple roll mil to produce ink compositions for the use of printed circuit boards.

Evaluation of Pigment Dispersion (1) Paint

Color was developed by the application of each of the paints obtained from the powdery pigment compositions in Examples and Comparative Examples, and clearness and color strength were measured relative to those of Compara tive Examples by using a color difference meter. Fogging was evaluated visually. The results are shown in Table 1.

TABLE 1

|  | Clearness $\Delta C^*$ | Color Strength (%) | Fogging |
| --- | --- | --- | --- |
| Example 1 | 9.5 | 135 | NONE |
| Compar. Example 1 | — | 100 | OBSERVED |
| Example 2 | 2.1 | 110 | NONE |
| Compar. Example 2 | — | 100 | OBSERVED |
| Example 3 | 6.7 | 126 | NONE |
| Compar. Example 3 | — | 100 | OBSERVED |

(2) Gravure Ink, Evaluation 1

Color was developed on a coated paper by the application of each of gravure inks obtained via the above-mentioned procedure with a #4 bar coater, and hue and clearness were measured by a color difference meter. Fogging was visually evaluated. Gloss was measured by a digital deformation glossimeter (manufacture by Suga Test Instruments). The results are shown in Table 2.

TABLE 2

|  | Clearness $\Delta C^*$ | Color Strength (%) | Gloss (%) | Fogging |
| --- | --- | --- | --- | --- |
| Example 1 | 6.6 | 125 | 25 | NONE |
| Compar. Example 1 | — | 100 | 18 | OBSERVED |
| Example 2 | 2.5 | 105 | 25 | NONE |
| Compar. Example 2 | — | 100 | 23 | OBSERVED |
| Example 3 | 3.8 | 112 | 21 | NONE |
| Compar. Example 3 | — | 100 | 13 | OBSERVED |

(3) Gravure Ink, Evaluation 2

For reference, C. I. PIGMENT GREEN 7, a green pigment that conventionally had been typically used (LIONOL GREEN Y-102, manufactured by Toyo Ink Mfg.) was processed into gravure ink by the same procedure, and developed on a SK coated paper. Pigment compositions obtained in Examples 1 to 3 and Comparative Examples 1 to 3 were also processed into gravure inks and developed on SK coated papers. In this operation, the use amount thereof was controlled to give the same concentration as the reference developed color, and used in. development. For example, the amount of the pigment composition of Example 1 required for giving the same developed concentration as in the gravure ink using Y-102 was about half of the amount of the pigment used in the reference ink. In Table 3, the amount of each pigment composition used required for giving the same developed concentration as in Y-102 reference was represented by % based on the amount of the pigment used in the reference ink. For evaluation of fogging, each ink was developed on a triacetate film, and judged visually.

TABLE 3

|  | Amount # | Clearness $\Delta C^*$ | Hue $\Delta H°$ | Gloss (%) | Fogging |
| --- | --- | --- | --- | --- | --- |
| Y-102 | 100 | — | — | 50 | NONE |
| Example 1 | 48 | −0.9 | −0.3 | 58 | NONE |
| Compar. Example 1 | 60 | −6.6 | 1.5 | 55 | OBSERVED |
| Example 2 | 68 | −3.7 | 1.3 | 55 | NONE |
| Compar. Example 2 | 71 | −8.1 | 0.5 | 48 | OBSERVED |
| Example 3 | 52 | −1.5 | 0.6 | 54 | NONE |
| Compar. Example 3 | 59 | −7.2 | 0.5 | 50 | OBSERVED |

Amount of pigment composition required (4) Gravure Ink, Evaluation 3: Light Resistance Each colored sample wherein color had been developed on a SK coated paper was subjected to an accelerated light resistance test using a fade mater for 144 hours. For evaluation, color difference (ΔE) of the same sample after exposure for 144 hours was measured, relative to that of a sample not exposed, by using a color difference meter. The visual observation results are also shown in Table 4.

TABLE 4

|  | ΔE | Visual Observation |
| --- | --- | --- |
| Y-102 | 2.7 | Excellent |
| Example 1 | 2.9 | Excellent |
| Compar. Example 1 | 5.8 | Discoloration |
| Example 2 | 2.7 | Excellent |
| Compar. Example 2 | 3.8 | Slight discoloration |
| Example 3 | 3.0 | Excellent |
| Compar. Example 3 | 5.1 | Discoloration |

(5) Offset Ink

Each offset ink produced in the procedure above described was applied onto an art paper by a RI tester, and hue and clearness were measured by a color difference meter, and color strength was measured by a densitometer. Gloss was measured by a digital deformation glossimeter (manufacture by Suga Test Instruments).

TABLE 5

|  | Clearness ΔC* | Color Strength (%) | Gloss (%) |
| --- | --- | --- | --- |
| Example 1 | 2.1 | 115 | 68 |
| Compar. Example 1 | — | 100 | 65 |

(6) Coloring Pellet

Each pigment dispersion in plastics (colored pellet) produced in the above-mentioned procedure was injection-molded at 220° C., and fogging of the resulted full shade plate was judged visually. Further, on a tinting shade plate in which color was regulated so that the ratio of the pigment to a white pigment (TiO$_2$) was 1:20 by weight, color strength and clearness were measured by a color difference meter. The results are shown in Table 6.

Further, as a heat resistance test, color differences observed in full and tinting shade plates obtained by injection molding at 260° C. were evaluated, both visually and using a colour difference meter (ΔE), while using the above-mentioned full and tinting shade plates obtained by injection molding at 220° C. as the reference. The results are shown in Table 7.

TABLE 6

|  | Fogging | Clearness ΔC* | Color Strength (%) |
| --- | --- | --- | --- |
| Example 3 | NONE | 6.1 | 110 |
| Compar. Example 3 | OBSERVED | — | 100 |

TABLE 7

| | Result of heat resistance test | | |
| --- | --- | --- | --- |
|  | Visual judgment | Full Shade ΔE | Tinting Shade ΔE |
| Example 3 | Excellent | 1.2 | 0.6 |
| Compar. Example 3 | Heavy discolored | 2.5 | 2.1 |

(7) Ink for Printed Circuit Board

For reference, a commercially available green pigment, C. I. PIGMENT GREEN 7 (LIONOL GREEN YS-07, manufactured by Toyo Ink Mfg.), was processed into ink, applied onto a film to give a thickness of 25 micron, and thermally cured to obtain the reference specimen. The pigment compositions obtained in Examples 4 and 5 and Comparative Example 4 were processed into inks in the same manner, and specimens were obtained, respectively. On the resulted specimens, evaluations were conducted using a colour difference meter and a densitometer. Regarding fogging and transparency, specimens were prepared having the same concentration as that of the specimen of the reference YS-07, and they were judged visually.

TABLE 8

|  | Hue ΔH° | Color Strength (%) | Fogging | Transparency |
| --- | --- | --- | --- | --- |
| YS-07 |  | 100 | NONE | Standard level |
| Example 4 | 0.7 | 185 | NONE | Transparent |
| Example 5 | 2.0 | 150 | Observed slightly | Transparent |
| Compar. Example 4 | 3.7 | 105 | Observed | Opaque |

Industrial Applicability

In printed materials and colored materials produced by using a green pigment composition prepared by the method of the present invention, no "fogging" problem occur at all, and sufficient light resistance and heat resistance are secured simultaneously, unlike those obtained by simple color regulation in ink formula and paint formula. Therefore, a green pigment composition prepared by the method of the present invention shows excellent durability also in plastics coloring use requiring a beating process at 200° C. or more, and contains no halogen at all. Namely, it is a pigment composition that does not generate a harmful chemical substance even in incineration, has high safety/sanitation property, and causes no environmental problem.

What is claimed is:

1. A method for preparing an organic green pigment composition, said method comprising subjecting a mixture of an organic halogen-free blue pigment material and an organic halogen-free yellow pigment material to an atomizing process, wherein the ratio of said organic halogen-free blue pigment material to said organic halogen-free yellow pigment material is from 90:10 to 40:60 by weight.

2. The method according to claim 1, wherein said atomizing process is a co-kneading process conducted in the presence of a grinding agent.

3. The method according to claim 2, wherein said co-kneading is conducted in the presence of a glycol solvent.

4. The method according to claim 2, wherein said grinding agent is an inorganic salt.

5. The method according to claim 1, wherein aid atomizing process comprises (a) dissolving said organic blue pigment material and said organic yellow pigment material in a strong acid to obtain a solution and (b) injecting the solution into water to obtain a re-deposited substance.

6. The method according to claim 5, wherein said strong acid is at least one selected from the group consisting of sulfuric acid, trifluoroacetic acid, polyphosphoric acid and chlorosulfonic acid.

7. The method according to claim 1, wherein said organic blue pigment material is at least one organic pigment material selected from the group consisting of an organic phthalocyanine, threne and indigo organic blue pigment.

8. The method according to claim 1, wherein said organic yellow pigment material is at least one organic pigment material selected from the group consisting of an organic azo, benzimidazolone, isoindoline, flavanthrone, anthrapyrimidine, anthraquinone, quinolinoquinolone, fluoroflavine and fluorovine organic yellow pigment.

9. The method according to claim 1, wherein said organic yellow pigment material is at least one organic pigment material selected from the group consisting of an organic quinoloquinolone, fluoflavine and fluorovine organic yellow pigment.

10. The method according to claim 2, further comprising mixing a pigment cake product obtained from the co-kneading process with water to give slurry.

11. The method according to claim 2, wherein the organic halogen-free blue pigment material is a crude pigment material.

12. The method according to claim 11, wherein the organic halogen-free yellow pigment material is a high-grade pigment material.

13. The method according to claim 2, wherein the co-kneading is carried out at a temperature of 40 to 110° C.

14. The method according to claim 2, wherein the co-kneading is carried out at a temperature of 80 to 100° C.

15. The method according to claim 2, wherein the co-kneading process is carried out with a mixed powder of the organic halogen-free blue pigment material and the organic halogen-free yellow pigment material.

16. An organic pigment dispersion comprising an organic green pigment composition prepared by the method of claim 1.

17. The organic pigment dispersion according to claim 16, further comprising a vehicle in an amount effective for dispersing said organic green pigment composition.

18. The organic pigment dispersion according to claim 17, wherein the vehicle is at least one selected from the group consisting of offset ink vehicles, gravure ink vehicles, paint vehicles, ink vehicles applied to printed circuit board surfaces, toner resins and molding plastic resins.

* * * * *